(12) United States Patent
Chen et al.

(10) Patent No.: US 11,516,925 B2
(45) Date of Patent: Nov. 29, 2022

(54) PACKAGE STACK STRUCTURE AND METHOD FOR MANUFACTURING THE SAME

(71) Applicant: Siliconware Precision Industries Co., Ltd., Taichung (TW)

(72) Inventors: Han-Hung Chen, Taichung (TW); Yuan-Hung Hsu, Taichung (TW); Chang-Fu Lin, Taichung (TW); Rung-Jeng Lin, Taichung (TW); Fu-Tang Huang, Taichung (TW)

(73) Assignee: Siliconware Precision Industries Co., Ltd, Taichung (TW)

( * ) Notice: Subject to any disclaimer, the term of this patent is extended or adjusted under 35 U.S.C. 154(b) by 0 days.

(21) Appl. No.: 16/856,259

(22) Filed: Apr. 23, 2020

(65) Prior Publication Data

US 2020/0258871 A1  Aug. 13, 2020

Related U.S. Application Data

(62) Division of application No. 15/865,999, filed on Jan. 9, 2018, now abandoned.

(30) Foreign Application Priority Data

Mar. 31, 2017  (TW) ................................ 106111065

(51) Int. Cl.
| | | |
|---|---|---|
| *H05K 3/46* | (2006.01) | |
| *H01L 21/02* | (2006.01) | |
| *H05K 3/34* | (2006.01) | |
| *H01L 21/56* | (2006.01) | |
| *H01L 23/498* | (2006.01) | |
| *H01L 25/065* | (2006.01) | |
| *H01L 21/683* | (2006.01) | |

(Continued)

(52) U.S. Cl.
CPC ..... *H05K 3/4682* (2013.01); *H01L 21/02109* (2013.01); *H01L 21/56* (2013.01); *H01L 21/6835* (2013.01); *H01L 23/49822* (2013.01); *H01L 25/0657* (2013.01); *H01L 25/105* (2013.01); *H01L 25/50* (2013.01); *H05K 3/34* (2013.01); *H01L 23/3128* (2013.01); *H01L 23/49816* (2013.01); *H01L 23/5389* (2013.01); *H01L 2221/68345* (2013.01); *H01L 2224/32225* (2013.01); *H01L 2224/48227* (2013.01); *H01L 2224/73204* (2013.01); *H01L 2225/1035* (2013.01); *H01L 2225/1058* (2013.01); *H01L 2924/15311* (2013.01); *H01L 2924/181* (2013.01); *H05K 1/186* (2013.01); *H05K 3/007* (2013.01); *H05K 2203/0152* (2013.01)

(58) Field of Classification Search
CPC ..................... H01L 21/568; H01L 2021/6006
See application file for complete search history.

(56) References Cited

U.S. PATENT DOCUMENTS

| | | |
|---|---|---|
| 8,021,930 B2 | 9/2011 | Pagaila |
| 8,158,888 B2 | 4/2012 | Shen et al. |

(Continued)

*Primary Examiner* — David A Zarneke
(74) *Attorney, Agent, or Firm* — Hsuanyeh Law Group P.C.

(57) ABSTRACT

The present disclosure provides a package stack structure and a method for manufacturing the same. The method is characterized by stacking coreless circuit portions on the board of an electronic component to reduce the overall thickness of the package stack structure.

8 Claims, 5 Drawing Sheets

(51) Int. Cl.
*H01L 25/10* (2006.01)
*H01L 25/00* (2006.01)
*H05K 1/18* (2006.01)
*H05K 3/00* (2006.01)
*H01L 23/31* (2006.01)
*H01L 23/538* (2006.01)

(56) References Cited

U.S. PATENT DOCUMENTS

| | | |
|---|---|---|
| 8,193,034 B2 | 6/2012 | Pagaila et al. |
| 8,916,481 B2 | 12/2014 | Gan et al. |
| 8,980,691 B2 | 3/2015 | Lin |
| 9,343,421 B2 | 5/2016 | Wang et al. |
| 9,818,734 B2 * | 11/2017 | Lin .................. H01L 23/49811 |
| 10,186,467 B2 * | 1/2019 | Appelt .................. H01L 21/486 |
| 2015/0001708 A1 * | 1/2015 | Lin ..................... H01L 23/5389 257/737 |

* cited by examiner

PACKAGE STACK STRUCTURE AND METHOD FOR MANUFACTURING THE SAME

CROSS-REFERENCE TO RELATED APPLICATION(S)

This application is a divisional of copending application U.S. Ser. No. 15/865,999, filed on Jan. 9, 2018, which claims under 35 U.S.C. § 119(a) the benefit of Taiwanese Application No. 106111065, filed on Mar. 31, 2017, the entire contents of which are incorporated herein by reference.

BACKGROUND

1. Technical Field

The present disclosure relates to package structures, and, more particularly, to a package stack structure and a method for manufacturing the same.

2. Description of Related Art

With the evolution of semiconductor packaging techniques, numerous types of packages have been developed for semiconductor devices. More particularly, a plurality of package structures are stacked on one another to form a package-on-package (POP) structure in order to enhance the electrical functionality and save space in the package. This type of packaging method takes advantage of the heterogeneous integration characteristic of system in packages (SiP), allowing various electronic components having different functionalities, such as memories, CPUs, graphics processors, image application processors, and the like, to be integrated together by stacking them. This makes it suitable for applications in compact and light electronic products.

FIGS. 1A and 1B are schematic cross-sectional diagrams depicting different aspects of a conventional package stack structure 1 and 1'.

As shown in FIG. 1A, the package stack structure 1 includes a first package substrate 11 and a second package substrate 12. The first package substrate 11 includes a plurality of circuit layers 110, and the second package substrate 12 includes a core layer 120 and a plurality of circuit layers 121. A first semiconductor component 10 is provided on the first package substrate 11 in a flip-chip manner, and then an underfill 14 is filled between the first semiconductor component 10 and the first package substrate 11. Second semiconductor components 15 are wire bonded on the second package substrate 12, and then an encapsulant 16 is used to encapsulate the second semiconductor components 15. A plurality of solder balls 13 are then stacked to electrically connect the first package substrate 11 and the second package substrate 12.

As shown in FIG. 1B, the package stack structure 1' includes a first package substrate 11 and a second package substrate 12. The first package substrate 11 includes a plurality of circuit layers 110, and the second package substrate 12 includes a core layer 120 and a plurality of circuit layers 121. A first semiconductor component 10 is provided on the first package substrate 11 in a flip-chip manner, and an underfill 14 is filled between the first semiconductor component 10 and the first package substrate 11. Then, a plurality of solder balls 13 are stacked to electrically connect the first package substrate 11 and the second package substrate 12. Thereafter, an encapsulant 16' is used to encapsulate the solder balls 13 and the first semiconductor component 10, and then second semiconductor components 15' are wire bonded on the second package substrate 12 in a flip-chip manner.

However, in the conventional package stack structures 1 and 1', the second package substrates 12 include the core layers 120, which makes it more difficult for the package stack structure 1, 1' to meet the demand of a thin structure.

Therefore, there is a need for a solution that addresses the aforementioned issues in the prior art.

SUMMARY

In view of the aforementioned shortcomings of the prior art, the present disclosure provides a package stack structure, which may include: a first unit including an insulating layer, a circuit portion and a plurality of conductive elements, wherein the insulating layer includes a first surface and a second surface opposite to the first surface, the circuit portion is combined with the insulating layer, the conductive elements are disposed vertically on the first surface of the insulating layer and in contact with the circuit portion, and the first unit includes no core layer; a board stacked on the first surface of the insulating layer via the conductive elements; and a first electronic component provided on the board.

In an embodiment, the package stack structure may further include a support portion combined on the second surface of the insulating layer. In another embodiment, the support portion may include at least one metal layer, and is combined with the second surface of the insulating layer via the metal layer. In yet another embodiment, the support portion may include a plurality of metal layers and a plurality of isolation layers, and is combined with the second surface of the insulating layer via the metal layers.

The present disclosure also provides a method for manufacturing a package stack structure, which may include: providing a first unit including an insulating layer, a circuit portion, a plurality of conductive elements and a support portion, wherein the insulating layer includes a first surface and a second surface opposite to first surface, the circuit portion is combined with the insulating layer, the conductive elements are disposed vertically on the first surface of the insulating layer and in contact with the circuit portion, and the insulating layer is combined with the support portion via the second surface; disposing the first unit on a second unit, wherein the second unit includes a board and a first electronic component provided on the board, and the insulating layer, the circuit portion and the support portion are stacked on the board via the conductive elements; and removing the support portion after disposing the first unit on the second unit.

In an embodiment, the support portion includes at least one metal layer, and is combined with the second surface of the insulating layer via the metal layer.

In an embodiment, the support portion includes a plurality of metal layers and a plurality of isolation layers, and is combined with the second surface of the insulating layer via the metal layers.

In an embodiment, the circuit portion includes at least one circuit layer.

In an embodiment, an outer surface of the circuit portion is lower than the second surface of the insulating layer.

In an embodiment, the conductive elements are solder balls, copper core balls or metallic parts.

In an embodiment, the method may further include disposing a second electronic component on the second surface of the insulating layer.

In an embodiment, the method may further include forming an encapsulant between the first surface of the insulating layer and the board.

In an embodiment, the circuit portion is embedded in the insulating layer.

As is clear from the above, the package stack structure and the method for manufacturing the same according to the present disclosure allow the first unit to be stacked on the board of the second unit before the support portion is removed, thereby reducing the overall thickness of the package stack structure while maintaining stability of the first unit.

DETAILED DESCRIPTION OF THE EMBODIMENTS

Figure 1A:
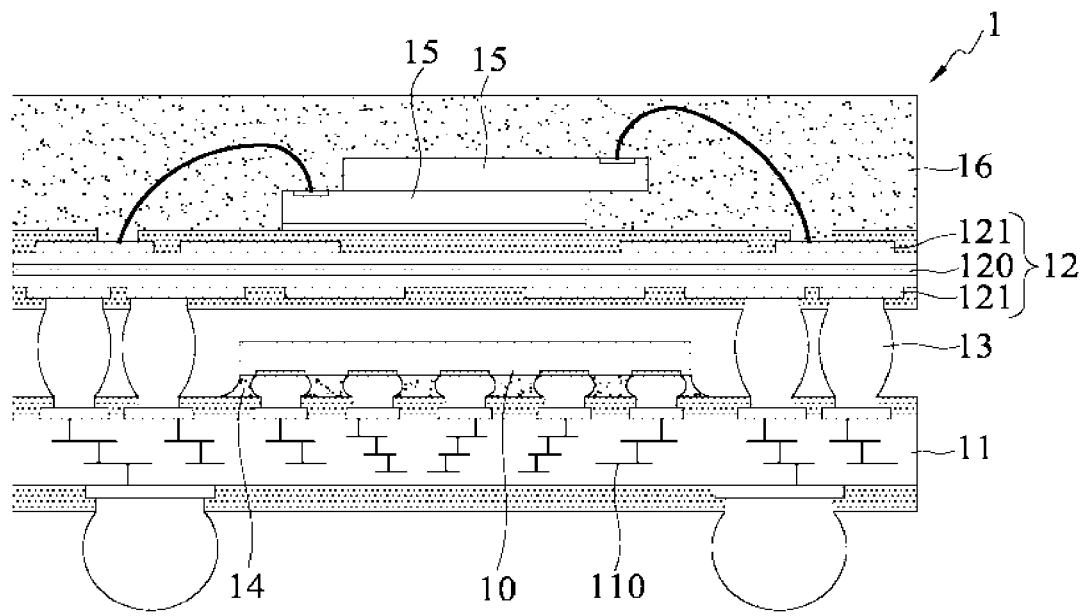
FIGS. 1A and 1B are schematic cross-sectional diagrams depicting different aspects of a conventional package stack structure.
Figure 1B:
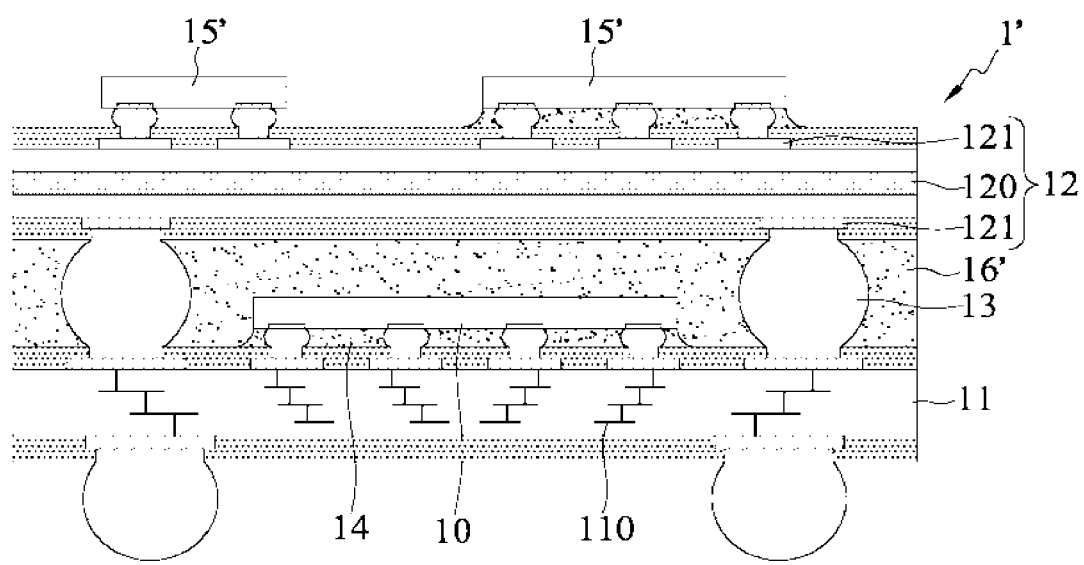

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "first", "second", "third", "one", "a", "an" and the like, are for illustrative purposes only, and are not meant to limit the range implementable by the present disclosure. Any changes or adjustments made to their relative relationships, without modifying the substantial technical contents, are also to be construed as within the range implementable by the present disclosure.

FIGS. 2A to 2D are schematic cross-sectional diagrams illustrating a method for manufacturing a package stack structure 2 in accordance with a first embodiment of the present disclosure.

Figure 2A:
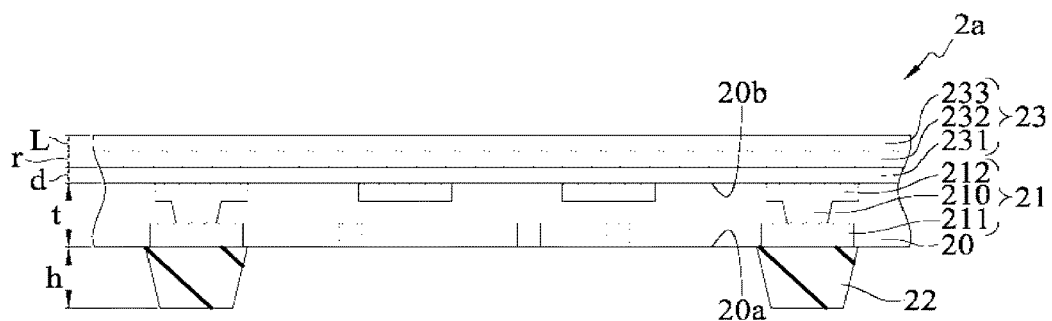
FIGS. 2A to 2D are schematic cross-sectional diagrams illustrating a method for manufacturing a package stack structure in accordance with a first embodiment of the present disclosure.

As shown in FIG. 2A, a first unit 2a is provided, which includes an insulating layer 20, a circuit portion 21, a plurality of conductive elements 22 and a support portion 23.

The insulating layer 20 includes a first surface 20a and a second surface 20b opposite to the first surface 20a, and the second surface 20b is combined with the support portion 23.

In an embodiment, the insulating layer 20 may be made of a dielectric material such as a prepreg, a molding compound, an Ajinomoto Build-up Film (ABF), or the like. In an embodiment, the thickness t of the insulating layer 20 is 15 µm.

The circuit portion 21 is combined with the insulating layer 20 by embedding itself, for example, in the insulating layer 20. In an embodiment, the circuit portion 21 includes a first circuit layer 211 embedded in the first surface 20a, a second circuit layer 212 embedded in the second surface 20b, and a plurality of conductive blind vias 210 electrically connecting the first and second circuit layers 211 and 212. It can be appreciated that the first and second circuit layers 211 and 212 can also be provided on the first surface 20a and the second surface 20b, respectively.

In an embodiment, the first circuit layer 211, the second circuit layer 212, and the conductive blind vias 210 may be made of copper, nickel/gold or other appropriate conductive materials.

The conductive elements 22 are provided vertically on the first surface 20a of the insulating layer 20 and are in contact with the first circuit layer 211 of the circuit portion 21.

In an embodiment, the conductive elements 22 are solder balls, copper core balls, metallic (e.g., copper or gold material) parts (in the shapes of columns, lumps or needles) or the like.

Moreover, there is no limit on the shapes of the conductive elements 22. In an embodiment, the conductive elements 22 can be of cone shape (i.e., their volumes taper from the bottom to the top) or other shapes.

In an embodiment, the height h of the conductive elements 22 protruding out of the first surface 20a can be, for example, 165 µm.

The support portion 23 can be a singulated board unit or the entire structure (i.e., including a plurality of units), in strip form or wafer form, for example.

In an embodiment, the support portion 23 comprises a first metal layer 231, a second metal layer 232 and a third metal layer 233, and is combined with the second surface 20b of the insulating layer 20 and the second circuit layer 212 via the first metal layer 231.

In an embodiment, the first and third metal layers 231 and 233 are copper layers, and the second metal layer 232 is a nickel layer.

In an embodiment, the thickness d of the first metal layer 231 and the thickness r of the second metal layer 232 are 3 µm, and the thickness L of the third metal layer 233 is 70 µm.

Figure 2B:
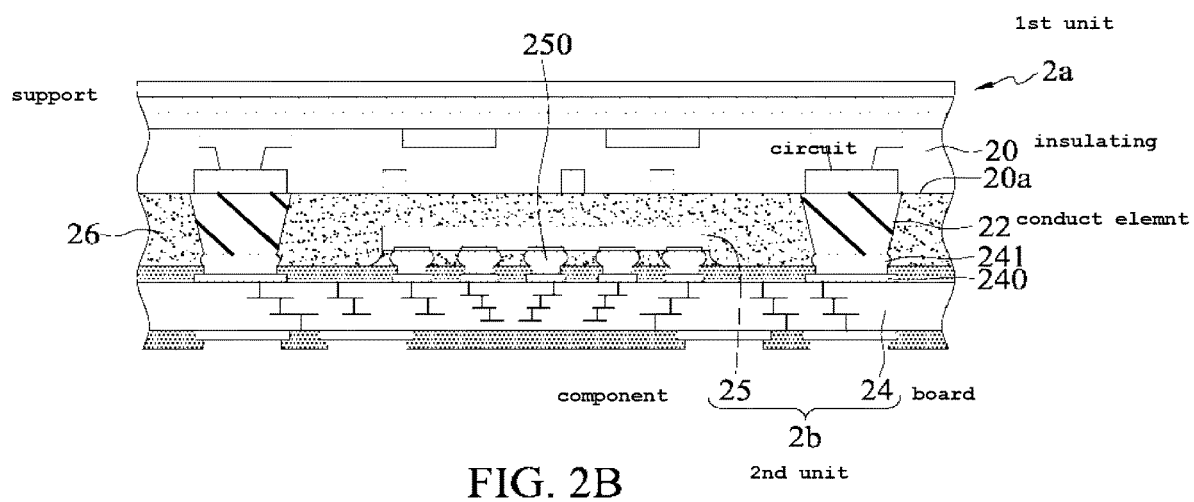

As shown in FIG. 2B, the first unit 2a is disposed on a second unit 2b, wherein the second unit 2b includes a board 24 and a first electronic component 25 provided on the board 24, and the first surface 20a of the insulating layer 20 is stacked on the board 24 (or the first unit 2a is stacked on the board 24). In an embodiment, an encapsulant 26 is formed between the first surface 20a of the insulating layer 20 and the board 24 to encapsulate the first electronic component 25 and the conductive elements 22.

The board 24 is a circuit structure with a core or a coreless circuit structure, such as a substrate, and includes, for example, circuit layout such as fan-out redistribution layers (RDLs). It can be appreciated that the board can also be other board material for carrying chips, such as a leadframe, a wafer, or other carrier with metal routings, and the present disclosure is not limited to those described above.

In an embodiment, the conductive elements 22 are melted and combined onto solder materials 241 on conductive pads 240 of the board 24.

The first electronic component 25 can be an active component, a passive component or a combination of both, wherein the active component can be a semiconductor chip, for example, and the passive component can be a resistor, a capacitor, or an inductor, for example.

In an embodiment, the first electronic component 25 is disposed on the board 24 in a flip-chip manner and electrically connected with the board 24 via a plurality of conductive bumps 250 (such as a solder material). In another embodiment, the first electronic component 25 can be wire bonded and electrically connected to the board 24 via a plurality of bonding wires (not shown). In yet another embodiment, the first electronic component 25 may be in direct contact with the circuits on the board 24. Nevertheless, the way in which the first electronic component 25 is electrically connected with the board 24 is not limited to those described above.

The encapsulant 26 can be formed using polyimide (PI), a dry film, an epoxy resin, a molding compound, or the like, and the present disclosure is not limited as such.

Figure 2C:
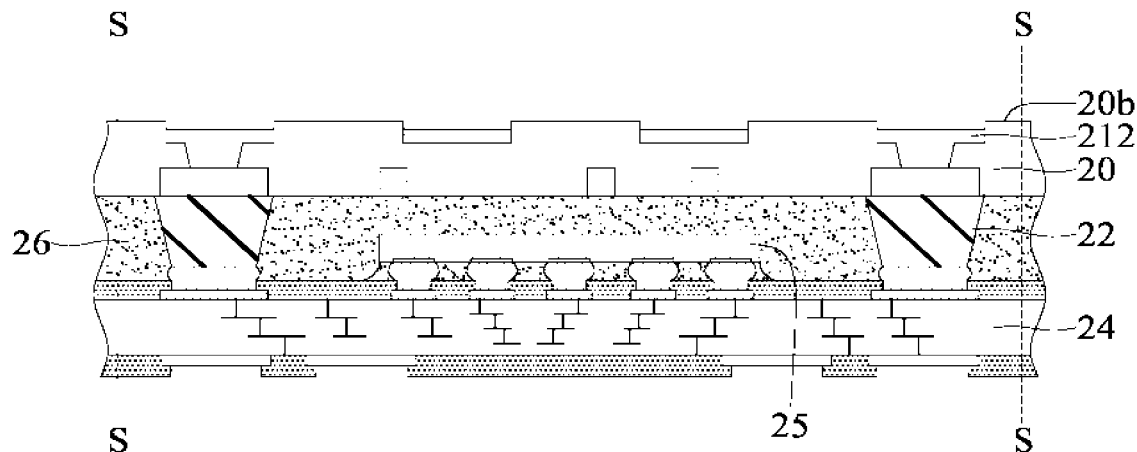

As shown in FIG. 2C, the support portion 23 is removed, and the second circuit layer 212 is exposed from the second surface 20b of the insulating layer 20.

In an embodiment, the third metal layer 233 and the second metal layer 232 are removed through an etching process to obtain a planar surface. Then, the first metal layer 231 is micro-etched extending down to 3 to 5 μm below the second surface 20b of the insulating layer 20 (i.e., removing a portion of the second circuit layer 212), such that the outer surface of the second circuit layer 212 of the circuit portion 21 is lower than the second surface 20b of the insulating layer 20.

It can be understood that, if the support portion 23 is removed before the insulating layer 20 with the embedded circuit portion 21 is stacked on the board 24, during the process of removing the support portion 23, the first unit 2a due to a lack of rigidity cannot be held stably. This may cause shifting of the first unit 2a, and the insulating layer 20 cannot be picked and placed by the machine. Therefore, in the method according to the present disclosure, the first unit 2a is first stacked on the board 24 before the support portion 23 is removed, and the first unit 2a is thus held stably through the board 24 (and the encapsulant 26) during the thinning process (i.e., removal of the support portion 23), resolving the issue of the pick and place failure because of a lack of rigidity.

Figure 2D:
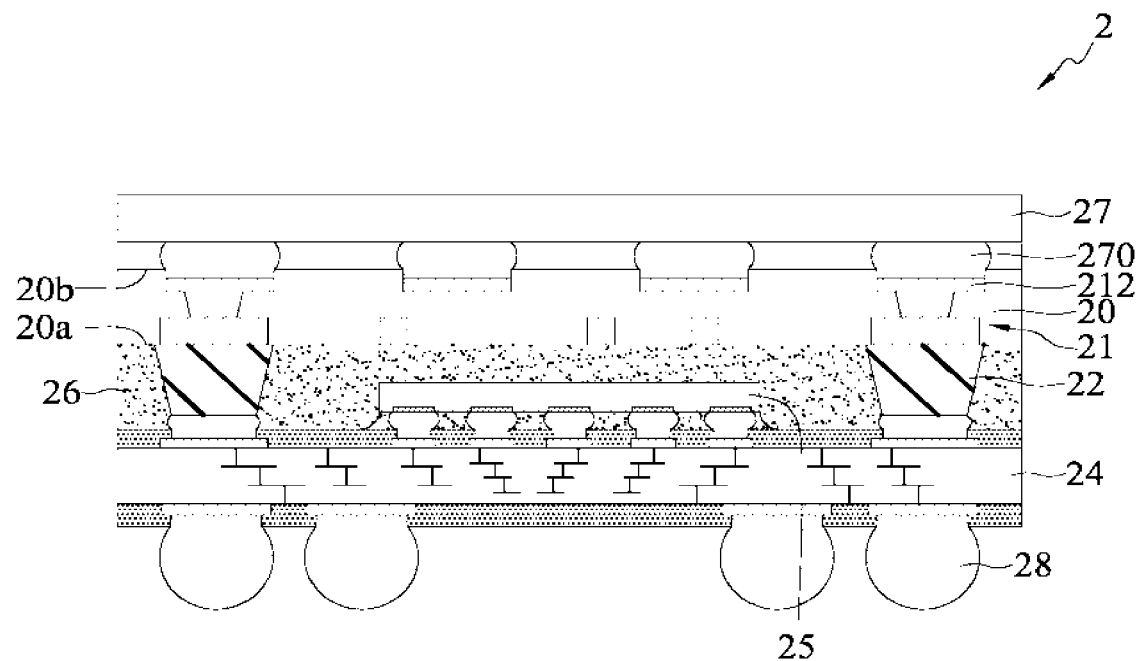

As shown in FIG. 2D, the structure of FIG. 2C is singulated along a cutting path S shown in FIG. 2C, then a second electronic component 27 is disposed on the second surface 20b of the insulating layer 20, and conductive elements such as solder balls 28 are planted below the board 24.

In an embodiment, the second electronic component 27 can be a package, an active component, a passive component, or a combination of the above, wherein the package is, for example, a chip scale package (CSP), the active component can be a semiconductor chip, for example, and the passive component can be a resistor, a capacitor, or an inductor, for example. In an embodiment, the second electronic component 27 is stacked on the second surface 20b and electrically connected with the second circuit layer 212 via a plurality of conductive bumps 270 such as a solder material. In another embodiment, the second electronic component 27 can be wire bonded and electrically connected to the second circuit layer 212 via a plurality of bonding wires (not shown). In yet another embodiment, the second electronic component 27 may be in direct contact with the second circuit layer 212. Nevertheless, the way in which the second electronic component 27 is electrically connected with the second circuit layer 212 is not limited to those described above.

In the method according to the present disclosure, the first unit 2a is first stacked on the board 24 of the second unit 2b, and then a portion of the first unit 2a is removed (i.e., the support portion 23 is removed). Thus, compared to the prior art, the method according to the present disclosure reduces the overall thickness of the package stack structure 2 since the coreless circuit portion 21 is stacked on the board 24.

FIGS. 3A to 3D are schematic cross-sectional diagrams illustrating a method for manufacturing a package stack structure 3 in accordance with a second embodiment of the present disclosure. The second embodiment and the first embodiment differ only in the structure of the first unit.

Figure 3A:
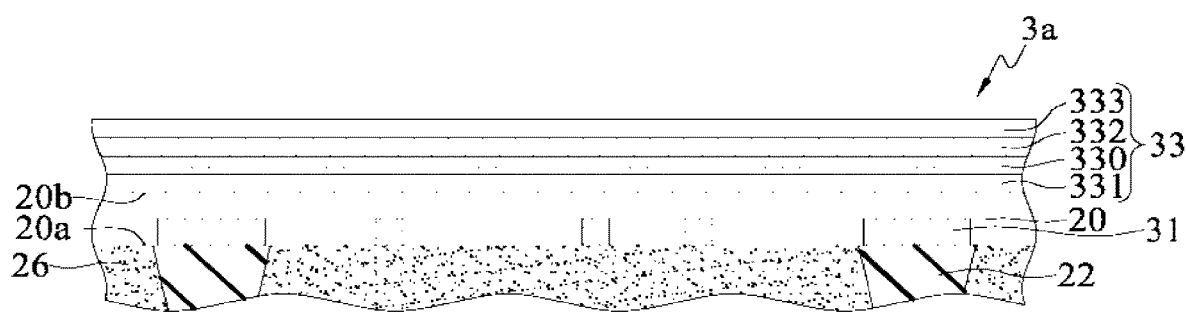
FIGS. 3A to 3D are schematic partial cross-sectional diagrams illustrating a method for manufacturing a package stack structure in accordance with a second embodiment of the present disclosure.

As shown in FIG. 3A, which is similar to the process shown in FIG. 2B, a first unit 3a including the insulating layer 20, a circuit portion 31, a plurality of conductive elements 22, and a support portion 33 is stacked on the board 24 of the second unit 2b, and the encapsulant 26 is formed between the first surface 20a of the insulating layer 20 and the board 24.

The circuit portion 31 is a single circuit layer that is embedded in the first surface 20a of the insulating layer 20.

The conductive elements 22 are disposed vertically on the first surface 20a of the insulating layer 20, are in contact with the circuit portion 31, and are melted and combined onto the board 24.

The support portion 33 includes first and second metal layers 331 and 332 and first and second isolation layer 330 and 333, and is bonded to the second surface 20b of the insulating layer 20 via the first metal layer 331.

In an embodiment, the insulating layer 20 and the second isolation layer 333 can be made of Ajinomoto Build-up Films (ABFs), the first and second metal layers 331 and 332 can be made of copper layers, and the first isolation layer 330 acts as a core layer. It can be appreciated that the first unit 3a is a symmetrical structure about the core layer. The insulating layer 20 and the second isolation layer 333 can be made of the same or different materials, and the structure of the first unit 3a is not limited to that described above.

Figure 3B:
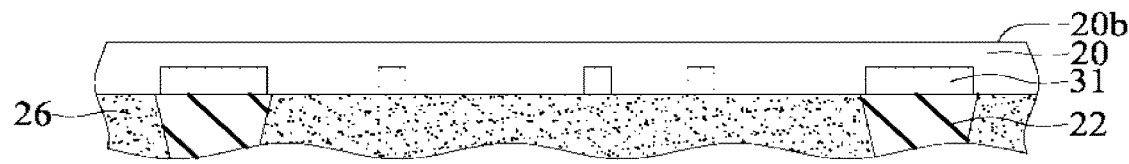

As shown in FIG. 3B, the support portion 33 is removed by grinding to expose the second surface 20b of the insulating layer 20.

Figure 3C:
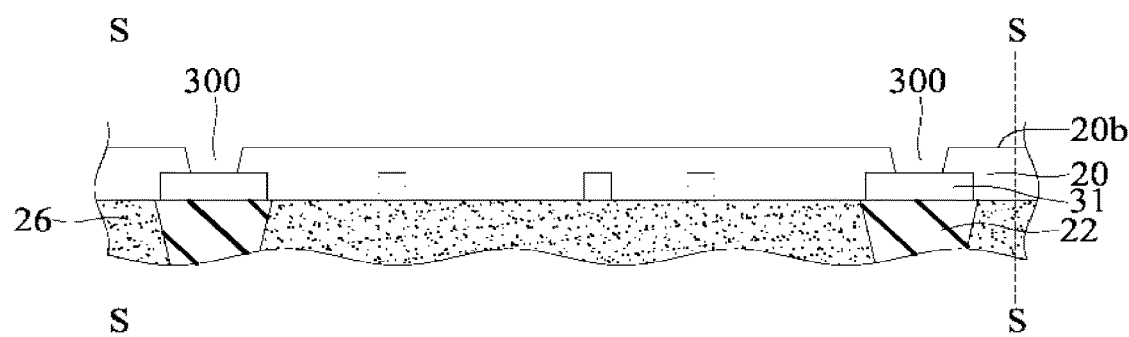

As shown in FIG. 3C, a plurality of openings 300 are formed on the second surface 20b of the insulating layer 20 using laser drilling, for example, such that a portion of the circuit portion 31 is exposed from the second surface 20b of the insulating layer 20.

Figure 3D:
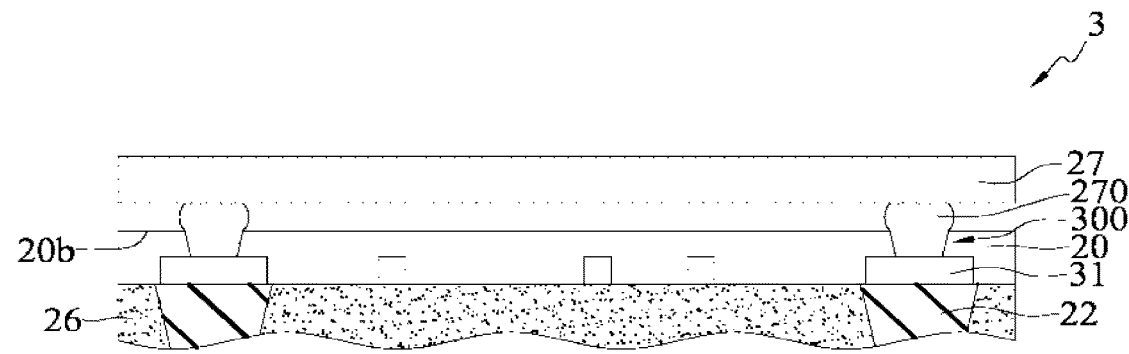

As shown in FIG. 3D, solder balls 28 are planted below the board 24, and singulation is performed. Then, the second electronic component 27 is disposed on the second surface 20b of the insulating layer 20, and conductive bumps 270 disposed in the openings 300 are electrically connected to the circuit portion 31.

In an embodiment, the first unit 3a is first stacked on the board 24, and then a portion of the first unit 3a is removed (i.e., the support portion 33 is removed). Thus, compared to the prior art, the method according to the present disclosure allows the first unit 3a to be held stably during the thinning process (i.e., removal of the support portion 33), and resolves the issue of the pick and place failure because of a lack of rigidity. The method according to the present disclosure also reduces the overall thickness of the package stack structure 3 since the coreless circuit portion 31 is stacked on the board 24.

Figure 4:
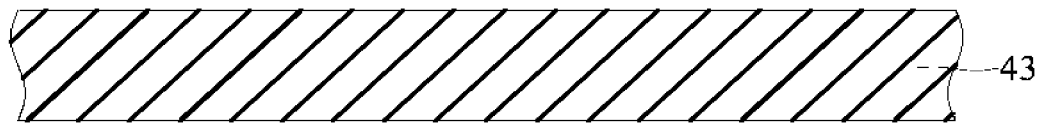
FIG. 4 is a schematic cross-sectional diagram illustrating a support portion of a first unit of the package stack structure in accordance with another embodiment of the present disclosure.

In an embodiment, as shown in FIG. 4, a support portion 43 of the first unit may also be a single metal layer, such as copper, iron or stainless steel, and is etched or ground away during the manufacturing process.

The present disclosure further provides a package stack structure 2, 3, which includes an insulating layer 20, a circuit portion 21, 31, a plurality of conductive elements 22, a board 24, and at least one first electronic component 25.

The insulating layer 20 includes a first surface 20a and a second surface 20b opposite to the first surface 20a.

The circuit portion 21, 31 is combined with the insulating layer 20, by embedding themselves, for example, in the insulating layer 20.

The conductive elements 22 are disposed vertically on the first surface 20a of the insulating layer 20 and in contact with the circuit portion 21, 31.

The board 24 is disposed on the conductive elements 22 in order to be stacked on the first surface 20a of the insulating layer 20.

The first electronic component 25 is provided on the board 24.

In an embodiment, the circuit portion 21, 31 includes at least one circuit layer.

In an embodiment, the outer surface of the circuit portion 21 is lower than the second surface 20b of the insulating layer 20.

In an embodiment, the conductive elements 22 are solder balls, copper core balls or metallic parts.

In an embodiment, the package stack structure 2, 3 further includes a second electronic component 27 provided on the second surface 20b of the insulating layer 20.

In an embodiment, the package stack structure 2, 3 further includes an encapsulant 26 formed between the first surface 20a of the insulating layer 20 and the board 24.

In an embodiment, the package stack structure 2, 3 further includes a support portion 23, 33, 43 combined on the second surface 20b of the insulating layer 20. In another embodiment, the support portion 23, 43 includes at least one metal layer (e.g., first to third metal layers 231, 232 and 233), and is combined with the second surface 20b of the insulating layer 20 via the metal layer. In yet another embodiment, the support portion 33 includes a plurality of metal layers (e.g., first and second metal layers 331 and 332) and a plurality of isolation layers (e.g., first and second isolation layers 330 and 333), and is combined with the second surface 20b of the insulating layer 20 via the metal layers.

In summary, the package stack structure and the method for manufacturing the same according to the present disclosure allow the first unit to be stacked on the board of the second unit before the support portion is removed, thereby reducing the overall thickness of the package stack structure while maintaining stability of the first unit.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A package stack structure, comprising:
    a first unit including an insulating layer, a circuit portion and a plurality of conductive elements, wherein the insulating layer includes a first surface and a second surface opposite to the first surface, the circuit portion is combined with the insulating layer and partially exposed from the second surface of the insulating layer, the conductive elements are disposed vertically on the first surface of the insulating layer and in contact with the circuit portion, and the first unit includes no core layer;
    a board stacked on the first surface of the insulating layer via the conductive elements;
    a support portion being a non-circuit structure combined on an entirety of the second surface of the insulating layer and a portion of the circuit portion, wherein the support portion is only made of a plurality of metal layers and is combined with the second surface of the insulating layer via one of the metal layers, and the metal layer is in direct contact with the insulating layer and the circuit portion; and
    a first electronic component provided on the board.

2. The package stack structure of claim 1, wherein the circuit portion includes at least one circuit layer.

3. The package stack structure of claim 1, wherein the circuit portion has an outer surface lower than the second surface of the insulating layer.

4. The package stack structure of claim 1, wherein the conductive elements are solder balls, copper core balls or metallic parts.

5. The package stack structure of claim 1, further comprising a second electronic component provided on the second surface of the insulating layer.

6. The package stack structure of claim 1, further comprising an encapsulant formed between the first surface of the insulating layer and the board.

7. The package stack structure of claim 1, wherein the support portion further includes a plurality of isolation layers combined with the metal layers.

8. The package stack structure of claim 1, wherein the circuit portion is embedded in the insulating layer.

* * * * *